United States Patent [19]
Imai et al.

[11] Patent Number: 5,909,914
[45] Date of Patent: Jun. 8, 1999

[54] ELECTRONIC PARTS MOUNTING METHOD

[75] Inventors: Kiyoshi Imai; Hideaki Watanabe; Dai Yokoyama, all of Kofu, Japan

[73] Assignee: Matsushita Electric Industrial Co., Ltd., Japan

[21] Appl. No.: 08/788,830

[22] Filed: Jan. 27, 1997

[30] Foreign Application Priority Data

Jan. 26, 1996 [JP] Japan ................................... 8-012263

[51] Int. Cl.⁶ .................................................. H05K 3/30
[52] U.S. Cl. .............................. 29/837; 29/564.1; 29/741
[58] Field of Search .............................. 29/740, 741, 837, 29/564.1

[56] References Cited

U.S. PATENT DOCUMENTS 4,196,513 4/1980 Harigane et al. .
5,339,248 8/1994 Fujiwara et al. .

*Primary Examiner*—Carl J. Arbes
*Attorney, Agent, or Firm*—Parkhurst & Wendel

[57] ABSTRACT

The present invention intends to make the time as long as possible during which a XY table which is interlocked to avoid the contact of an insert guide section and an anvil section moves for positioning thereof. For this purpose, the height of an electronic part mounted onto a substrate in the preceding step and electronic parts to be successively mounted are compared with the distance of an insert head section and the anvil section from the substrate, and such an interlock height as to prevent the mounted electronic parts from coming into contact with said insert head section or said anvil section is maintained and updated in accordance with the height of the highest electronic part among the mounted ones, thereby moving the XY table.

2 Claims, 4 Drawing Sheets

ELECTRONIC PARTS MOUNTING METHOD

FIELD OF THE INVENTION

The present invention relates to an electronic parts mounting method for automatically inserting an electronic part with a lead wire into the insert hole of a substrate.

BACKGROUND OF THE INVENTION

Conventional examples of electronic parts mounting methods for automatically insert an electronic part with a lead wire into the insertion hole of a substrate will be described referring to FIGS. 1 to 5.

In FIG. 1, an electronic parts mounting apparatus for automatically inserting an electronic part 5 with lead wires 6a, 6b into the insert holes 2a, 2b of a substrate 2 comprises an insert head section 1, an anvil section 4 and an XY table section 3. The insert head section 1 and the anvil section 4 are so positioned above and below the substrate 2 as to sandwich it, and vertically moved symmetrically in accordance with the inserting position of parts. The XY table section 3 holds the substrate 2 with the insert holes 2a, 2b for inserting the lead wires 6a, 6b and moves in the XY direction to position the aforesaid insert holes 2a, 2b to the aforesaid part insert positions.

First, the electronic part 5 equipped with the lead wires 6a, 6b retained at fixed intervals on the tapes 9a, 9b as shown in FIG. 2(a) is supplied to the aforesaid insert head 1.

Next, with the aforesaid insert head section 1, as shown in FIG. 2(b), electronic parts 5 are separated one by one from the tapes 9a, 9b and are lowered while retained at the insert guide sections 7a, 7b as shown in FIG. 3. The front ends of the lead wires 6a, 6b are pushed into the aforesaid insert holes 2a, 2b of the substrate 2, positioned on the XY table section 3, with bushers 8a, 8b and those of the aforesaid lead wires 6a, 6b are inserted into the aforesaid insert holes 2a, 2b. In parallel with this, the aforesaid anvil section 4 rises from below the aforesaid substrate 2 toward the aforesaid insert holes 2a, 2b so as to come up to a position symmetrical to the aforesaid insert head 1. The nails 4a, 4b of this anvil section 4 bend the front ends of the aforesaid lead wires 6a, 6b inward. After the completion of this operation, the insert head section 1 rises and the anvil section 4 lowers.

As mentioned above, electronic parts 5 are mounted onto the substrate 2 in the state shown in FIG. 5.

Then, the insert head section 1 rises and the anvil section 4 lowers. Until the insert guide sections 7a, 7b come down while holding the next electronic part, the XY table section 3 moves to position the insert holes 2a, 2b for inserting the lead wires 6a, 6b of the following part 5 to the aforesaid part insert positions.

As shown in FIG. 4, however, electronic parts 5 are mounted on the top face of the substrate 2, while electronic parts 10 are mounted on the bottom face of the substrate 2. Accordingly, the control proceeds by such interlocking that the XY table 3 begins to move the substrate 2 after the front ends of the insert guide 7a, 7b rise up to a higher position H6 than the height h6 of an electronic part 5 and the front ends of the nails 4a, 4b of the anvil section 4 lowers down to a lower position H10 than the height h10 of an electronic part 10.

With the background art, to simplify the control of this interlocking, the movement of the XY table 3 is so interlocked that the front ends of the insert guide 7a, 7b and the nails 4a, 4b of the anvil section 4 are kept so apart from the substrate 2 as not to make contact with the largest part to be mounted with the electronic parts mounting apparatus and to allow the XY table 3 to be movable regardless of the presence of electronic parts.

With an electronic parts mounting apparatus, however, an attempt to promote the mounting efficiency by shortening the mounting cycle time for vertical reciprocal movement of the insert head section 1 and the anvil section 4 requires it to shorten the positioning movement of the XY table 3 also in accordance with the aforesaid mounting cycle time. Meanwhile, an actual electronic parts mounting apparatus has a problem that the movement of the XY table 3 requires more time than the mounting cycle time because it moves the substrate 2 for positioning, namely, the shortening effect of the aforesaid mounting cycle time is reduced by such restriction of the moving time of the XY table 3.

DISCLOSURE OF THE INVENTION

In order to solve the above-mentioned problem, the present invention has a purpose in providing an electronic parts mounting method enabling the movable time of the XY table interlocked in a relation between the position of the insert head section and that of the anvil section for positioning to be made as long as possible. The electronic parts mounting method according to the present invention is a method comprising the steps of moving an XY table while retaining a substrate, successively positioning a plurality of insert holes provided in said substrate to parts insert positions, supplying an electronic part equipped with lead wires to an insert head section moving vertically reciprocally at said parts insert positions, lowering said insert head while holding said part, bending downward and inserting the lead wires of the part held at said insert positions into said insert holes and bending the front ends of said lead wires inward by rising of an anvil section vertically moving reciprocally at said parts insert positions, wherein the height of the electronic part mounted onto said substrate in the preceding step and the electronic parts to be successively inserted is compared with the distance of said insert head section and said anvil section from said substrate, an interlock height is maintained and updated in accordance with the height of the highest electronic part among the mounted ones, so that the mounted electronic parts never come into contact with said insert head section or said anvil section, and said XY table is moved.

With respect to the distance between the substrate and the insert guide section and the distance between the substrate and the anvil section, the above arrangement enables the interlock height to be maintained and updated in accordance with the height of the tallest electronic part among the mounted ones. Consequently, it becomes possible to minimize the time while the XY table is interlocked and immovable, thereby keeping the parts already mounted onto the substrate from coming into contact with the insert head section or the anvil section. As a result, the cycle time for the insert head section and the anvil section can be shortened, thereby displaying the utmost operating efficiency.

DESCRIPTION OF THE EMBODIMENTS

Figure 1:
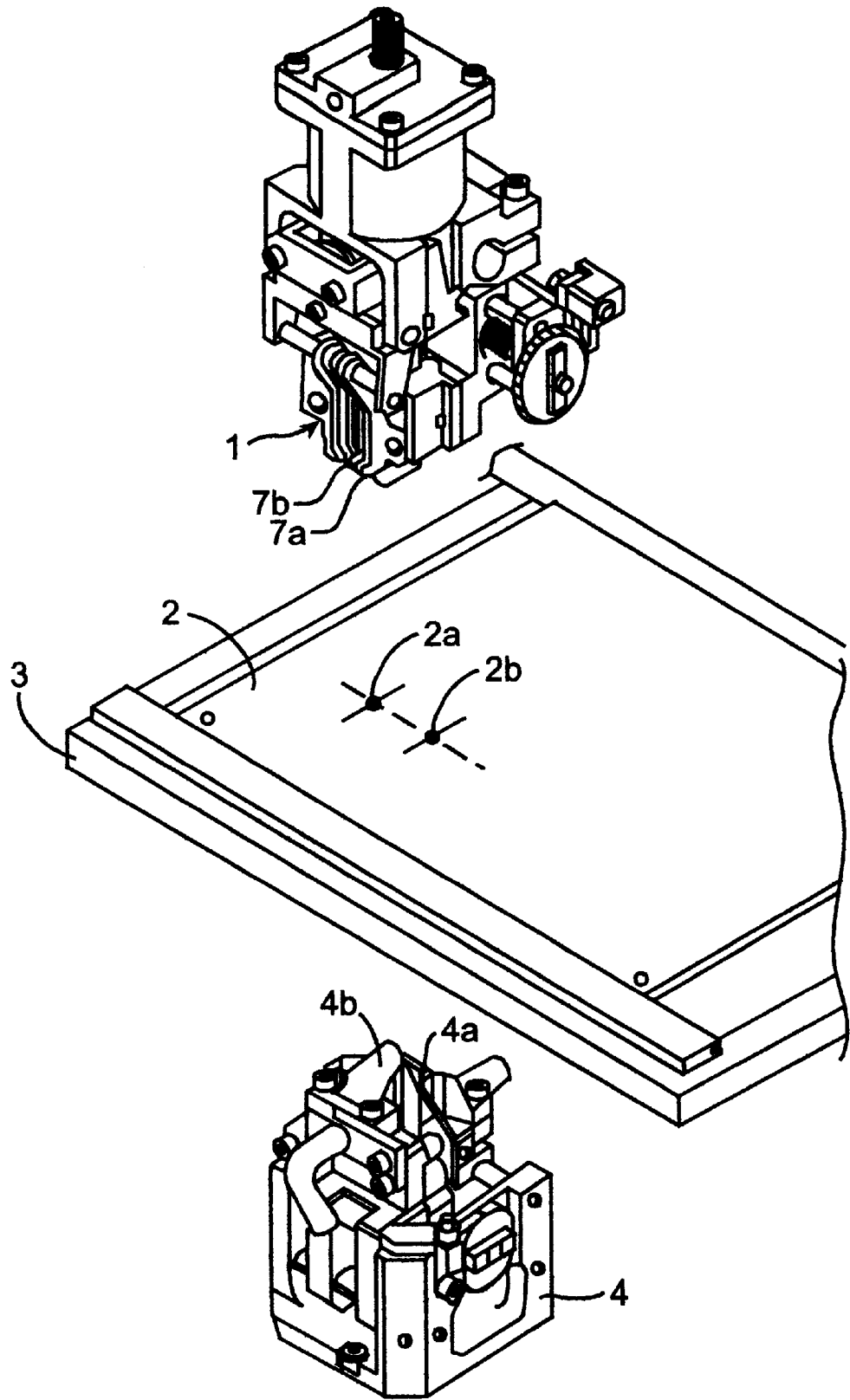
FIG. 1 is a perspective view showing the main portion of an electronic parts mounting apparatus for automatically inserting an electronic part equipped with lead wires into insert holes of a substrate.
Figure 2A:
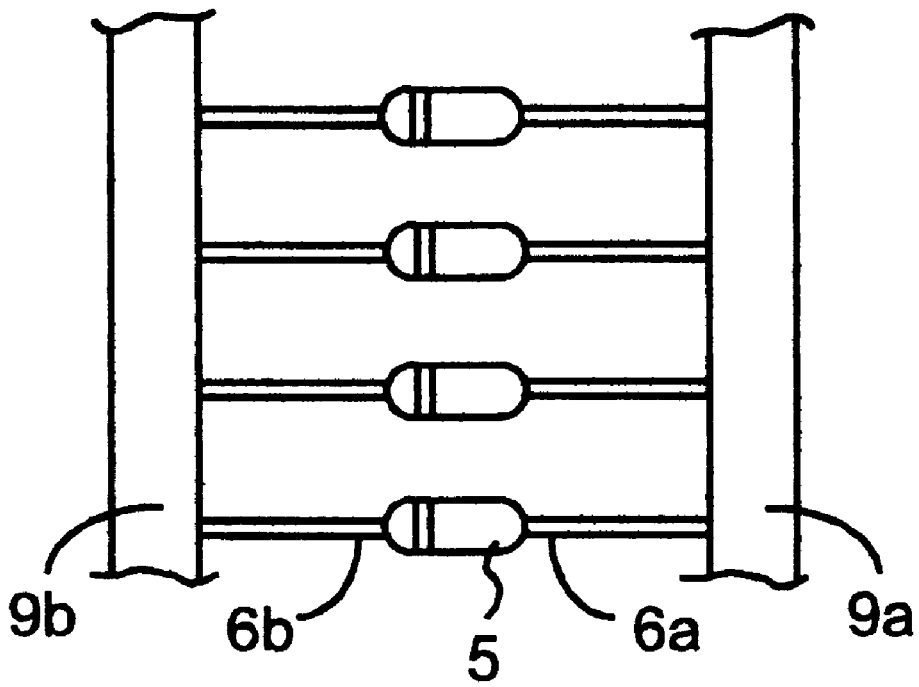
FIGS. 2(a)–(b) are plan views of electronic parts, equipped with lead wires, retained in a line on tapes and an electronic part separated from the tapes.
Figure 2B:
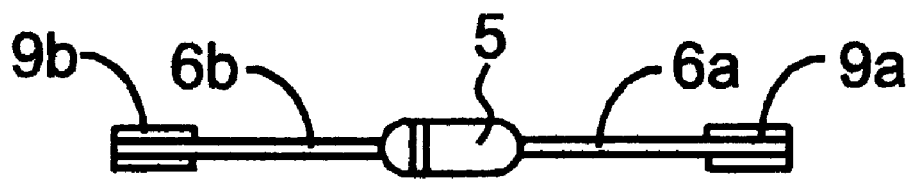
Figure 3:
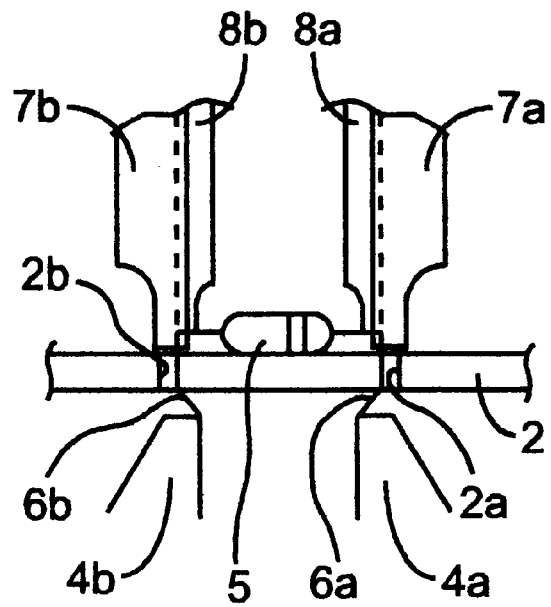
FIG. 3 is an illustration of the operation of an insert guide and pusher for mounting an electronic part equipped with lead wires.
Figure 4:
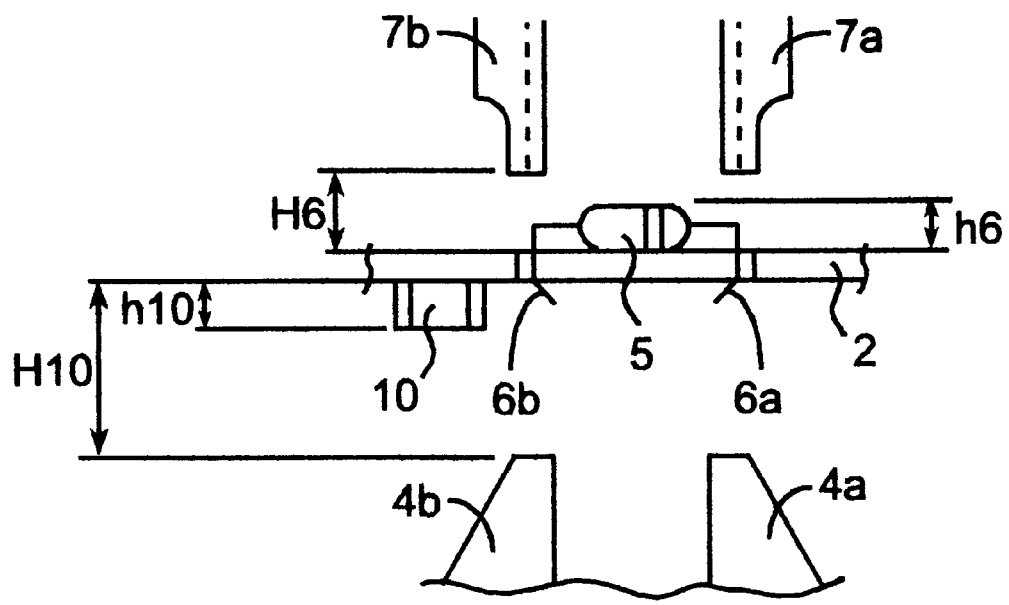
FIG. 4 is a side view showing the interlock height.
Figure 5:
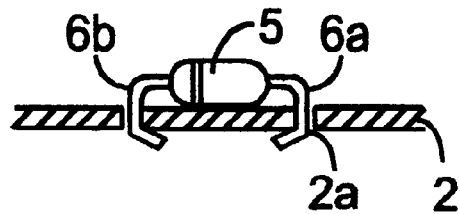
FIG. 5 is a side view showing an electronic part equipped with lead wires mounted onto a substrate.

Referring to FIGS. 1 to 7, one embodiment of electronic parts mounting method according to the present invention will be described.

With respect to the structure of the electronic parts mounting apparatus in this embodiment and the method for automatically inserting an electronic part equipped with lead wires 6a, 6b into insert holes 2a, 2b of a substrate 2, the description is omitted because of being the same as with a conventional example according to FIGS. 1 to 5.

This embodiment differs from a conventional example in that the interlocking condition for an XY table 3 is changed in accordance with the height of the electronic parts 5 and 10 actually mounted onto the substrate 2.

In the interlocking condition for a conventional example, it is so determined prior to the start of the mounting operation that the XY table 3 is movable if the distance between the front ends of the insert guide parts 7a, 7b and the substrate 2 and the distance between the front ends of the nails 4a, 4b of the anvil section 4 and the substrate 2 are respectively greater than the height of the tallest electronic parts to be mounted, but that the XY table 3 is immovable if they are smaller.

According to this method, however, even when the insert guide parts 7a, 7b and the nails 4a, 4b of the anvil section 4 begin to be detached from the substrate 2 after the completion of mounting, the XY table 3 cannot start a move to position the next insert holes 2a, 2b unless they are separated to the releasing position of the interlock (corresponding to the height of the tallest electronic part to be mounted). Consequently, the movable distance of the XY table 3 during the cycle time of the insert head section 1 and the anvil section 4 becomes shorter, so that there are cases where the XY table 3 is moving for the positioning even after the insert guide parts 7a, 7b hold an electronic part and the inserting preparation finishes. In such cases, it is required for the insert head section 1 and the anvil section 4 to stop and wait at such positions as not hindering the move of the XY table 3, and even if the cycle time of the insert head section 1 and the anvil section 4 is shortened, the effectiveness is reduced to some extent.

With this embodiment, it is arranged that the extent of interlock is reconsidered each time an electronic part is mounted in accordance with the height of the to-be-mounted electronic part, whereby the interlocking condition is maintained and updated so as to meet the height of the tallest electronic part among the electronic parts already mounted at that time.

For this reason, the electronic parts mounting apparatus is provided with a control section for reexamining and maintaining/updating the interlocking condition, whereby the parts data concerning all electronic parts to be mounted by the electronic parts mounting apparatus are stored in advance in the aforesaid control section. Each time an electronic part is mounted, the aforesaid control section selects the tallest electronic part among the mounted electronic parts on the basis of the aforesaid stored part data and maintains/updates the interlocking condition in accordance with the height of the tallest part.

Next, the operation of this embodiment will be described referring to FIG. 6.

Figure 6:
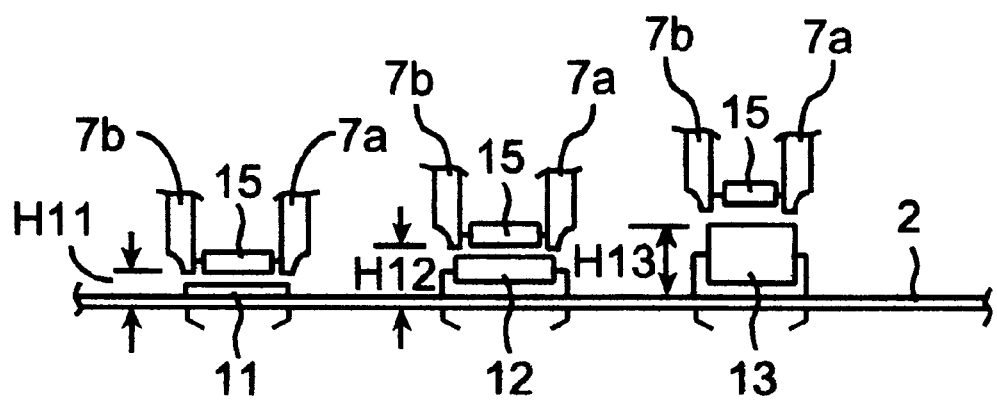
FIG. 6 is a side view showing the interlock height of an insert guide in one embodiment of the present invention.

In FIG. 6, when a jumper wire 11 is first mounted onto the substrate 2, the interlocking height H11 is established in accordance with the height of the mounted jumper line 11. Since the insert guide parts 7a, 7b hold an electronic part 15 equipped with lead wires in a stretched state as shown in FIG. 6, the interlocking height H11 remains constant both when the insert guide parts 7a, 7b rise and when they lower.

Next, when a part 12 is mounted, the interlocking height H12 is selected in accordance with the height of the mounted part 12. Incidentally, if this height H12 is lower than the interlocking height already established at that time point, the interlocking height is not updated and the interlocking height already established is maintained.

Furthermore, when a part 13 is mounted, the interlocking height H13 is selected in accordance with the height of the mounted part 13. Incidentally, if this height H13 is higher than the interlocking height already established at that time point, the interlocking height is updated to the aforesaid H13.

Figure 7:
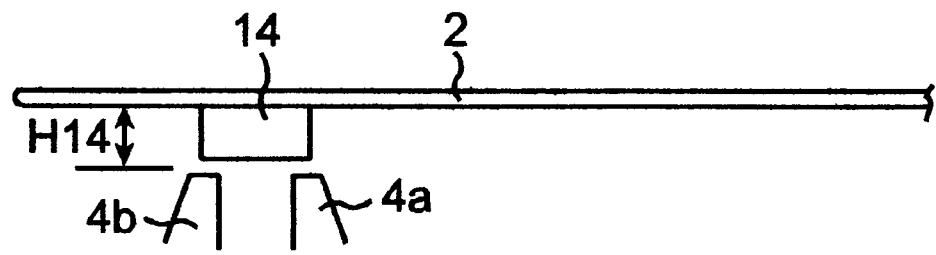
FIG. 7 is a side view showing the interlock height of an anvil section in one embodiment of the present invention.

In FIG. 7, a chip part 14 or the like is mounted onto the lower face of the substrate 2. Even in such cases, the interlocking height H14 is established in accordance with the height of the chip part 14 just like the case with the insert head section 1.

In this way, with respect to the distance between the front ends of the insert guide parts 7a, 7b and the substrate 2 and the distance between the front ends of the nails 4a, 4b of the anvil section 4 and the substrate 2, the interlocking height can be maintained/updated in accordance with the tallest part among the parts actually mounted. This embodiment is identical to a conventional example in that the XY table 3 needs be moved while making an interlock to avoid a contact between the electronic part 5 and the insert guides 7a, 7b and a contact between the electronic part 10 and the nails 4a, 4b of the anvil section 4, but it has an advantage in that the inoperable time of the XY table 3 being interlocked can be minimized and consequently the operating efficiency can be enhanced to the maximum by shortening the cycle time of the insert head section 1 and the anvil section 4.

What is claimed is:

1. In an electronic parts mounting method comprising the steps of arranging an insert head section and an anvil section at an upper position and a lower position of a substrate respectively in such a manner as to sandwich the substrate therebetween, moving an XY table while retaining the substrate, successively positioning a plurality of insert holes provided in said substrate to parts insert positions, supplying an electronic part equipped with lead wires having front ends to the insert head section vertically moving reciprocally at said parts insert positions, lowering said insert head while holding said electronic part, bending downward and inserting the lead wires of said electronic part held at said insert parts position into at least two of said plurality of insert holes, and bending the front ends of said lead wires inward by raising said anvil section vertically and moving reciprocally with said insert head at said parts insert positions, the improvement comprising:
previously storing data on every electronic part to be mounted in a control section;
comparing the height of the electronic part mounted on the substrate in the preceding step with the heights of the electronic parts to be mounted successively;

renewing the data on the highest electronic part each time an electronic part is mounted;

comparing each distance of the insert head section and the anvil section from the substrate with the height of the highest electronic part among the mounted ones;

maintaining and updating an interlock condition for preventing every mounted electronic part from coming into contact with the insert head section or the anvil section; and moving said XY table.

2. In an electronic parts mounting method comprising the steps of arranging an insert head section and an anvil section at an upper position and a lower position of a substrate respectively in such a manner as to sandwich the substrate therebetween, moving an XY table while retaining the substrate, successively positioning a plurality of insert holes provided in said substrate to parts insert positions, supplying an electronic part equipped with lead wires having front ends to the insert head section vertically moving reciprocally at said parts insert positions, lowering said insert head while holding said electronic part, bending downward and inserting the lead wires of said electronic part held at said insert parts position into at least two of said plurality of insert holes, and bending the front ends of said lead wires inward by raising said anvil section vertically and moving reciprocally with said insert head at said parts insert positions, the improvement comprising:

previously storing in a control section data on every electronic part to be mounted on the upper surface side of the substrate and data on every electronic part that has already been mounted on the lower surface side of the substrate;

comparing the height of the electronic part mounted on the upper surface side of the substrate in the preceding step with the heights of the electronic parts to be mounted successively, thereby to renew the data on the highest electronic part each time an electronic part is mounted anew;

comparing the distance of the insert head section and the anvil section from the upper and lower surface sides of the substrate, respectively, with that of the height of the highest electronic part among the mounted ones;

maintaining and updating an interlock condition preventing every mounted electronic part from coming into contact with the insert head section or the anvil section; and moving said XY table.

* * * * *